United States Patent
Carruthers

(10) Patent No.: US 7,049,825 B2
(45) Date of Patent: May 23, 2006

(54) DC GROUND FAULT DETECTION WITH RESISTIVE CENTERING

(75) Inventor: Peter Alexander Carruthers, Ithaca, NY (US)

(73) Assignee: BAE Systems Controls, Inc., Johnson City, NY (US)

( * ) Notice: Subject to any disclaimer, the term of this patent is extended or adjusted under 35 U.S.C. 154(b) by 109 days.

(21) Appl. No.: 10/826,193

(22) Filed: Apr. 15, 2004

(65) Prior Publication Data

US 2005/0231217 A1    Oct. 20, 2005

(51) Int. Cl.
*G01R 31/14* (2006.01)

(52) U.S. Cl. .................................. 324/509
(58) Field of Classification Search ........... 324/509
See application file for complete search history.

(56) References Cited

U.S. PATENT DOCUMENTS 4,947,469 A * 8/1990 Vokey et al. ............... 324/523
6,833,713 B1 * 12/2004 Schoepf et al. ............ 324/536

* cited by examiner

*Primary Examiner*—Anjan Deb
*Assistant Examiner*—John Teresinski
(74) *Attorney, Agent, or Firm*—Geoffrey H. Krauss; William H. Meise

(57) ABSTRACT

A method for determining the nature of a ground fault in a floating direct voltage load powering context includes measuring the load voltage and the current at a nominal balance point, both before and after closing a circuit to the load. The fault resistance and the fault voltage are determined as the solution to an equation in two unknowns given the conditions before and after application of load voltage or at least precharge.

5 Claims, 3 Drawing Sheets

DC GROUND FAULT DETECTION WITH RESISTIVE CENTERING

FIELD OF THE INVENTION

This invention relates to electrical fault detection in the context of direct voltages, and more especially to detection of the resistance and voltage to a nominally isolated ground.

BACKGROUND OF THE INVENTION

In the early days of electrical power, direct and alternating voltage power systems competed in the marketplace. Due to the ability of magnetic transformers to adjust voltage up and down, and also possibly as a result of the forces of advertising, the use of alternating voltage for powering homes and factories superseded the use of direct voltage. Early alternating-voltage (also known as alternating current or AC) systems were somewhat dangerous to the public, because of the possibility the case of equipment connected to the power line could become energized in the event of an internal fault. In such a situation, the ground or earth became part of the electrical path, and someone who inadvertently came into contact with the case of the equipment could experience the full alternating mains voltage. Many deaths occurred due to this effect.

Within the last fifty years or so, the use of "three-wire" or grounded systems has provided a large measure of protection against electrocutions due to undesired faults between the AC power lines and ground. The third wire grounded the case of the equipment and opened protective devices in the power distribution system, preventing the case from becoming energized. Somewhat later, "double insulated" products were introduced, which had a lesser likelihood of allowing personal contact with either side of the AC power line. Within the last twenty years or so, "ground fault interrupters" have been widely used, and in many cases mandated, for use in kitchens, bathrooms, and exterior power outlets. These interrupters monitor current flowing from the power distribution system to ground, and in the presence of ground currents deemed to be significant, which may be on the order of a few milliamperes, disconnect the load from the power source.

When alternating current (AC) became dominant for powering houses and factories, direct current systems continued to be used for certain purposes. These purposes included the powering of flashlights and other light duty applications by means of batteries, and the powering of ancillary systems such as lights, controls, and communications in mobile systems such pleasure boats, automobiles, and airplanes. For the most part, these battery-operated direct-voltage systems tended to have relatively low voltages. For example, an ordinary flashlight might have two series-connected 1½ volt batteries, for a total of 3 volts. Automobile accessories such as lamps-and engine self-starters were originally powered by six-volt batteries, which were supplanted by 12-volt batteries. Such voltages are low enough so that dry skin provides protection against the flow of significant current, to the extent that a person may not notice application of 12 volts to the body.

With the advent of modern electrically powered vehicles, the use of high power direct voltages has once again become important. The direct voltage powering arises because of the need to store electrical energy for mobile use, which at the current state of the art requires battery operation. Both all-electric and hybrid-electric vehicles use direct-voltage traction batteries to power traction motors to drive the vehicle.

Because of the large amounts of energy required to propel an automobile, the traction battery of an electrically powered vehicle must be suited to the provision of substantial energy, for at least a short time. Those skilled in the art know that a traction battery must have a relatively large storage capacity, and must deliver a relatively large amount of power, compared to a conventional 12 volt automobile storage battery. It is further understood that because power is directly proportional to battery voltage and system current, the high power delivery requirements which must be satisfied by traction batteries necessarily mean that higher electrical voltages (to keep current levels within a practical range) will be present in electric automobiles than in automobiles powered by fossil-fuel internal-combustion engines, which typically require only a comparatively low power, low voltage storage battery for energizing auxiliary loads when the internal combustion engine is not operating.

Hybrid electric vehicles (HEVs) combine the internal combustion engine of a conventional vehicle with the battery and electric motor of an electric vehicle. This results in an increase in fuel economy over conventional vehicles. The combination also offers extended range and rapid refueling that users expect from a conventional vehicle, with at least some of the energy and environmental benefits of an all-electric vehicle. The practical benefits of HEVs include improved fuel economy and lower emissions compared to conventional vehicles. The inherent flexibility of HEVs also permits their use in a wide range of applications, from personal transportation to commercial hauling.

Electric or hybrid-electric vehicles require less combustion of fossil fuels by comparison with conventional internal-combustion engines. Such vehicles are becoming increasingly attractive alternatives to fossil fuel powered cars. However, because of the high voltage requirements of its traction battery, an electric or hybrid electric vehicle raises significant electrical reliability and safety concerns.

It should be understood that the flow of electrical current is always in a loop, with the electrons leaving one terminal of the system (as for example a "+" battery terminal) and flowing to another terminal (the corresponding "−" terminal). Mere contact with a single terminal is insufficient, in itself, to establish a complete loop path which would allow the flow of electricity. In order to help in preventing unwanted flow of electrical energy in an electrical vehicle context, the traction battery and motor are often operated in an electrically "floating" or ungrounded mode, in which the traction battery and motor equipments are totally isolated from the housing or chassis in which it is located, so that the traction power system electrical current flows in a closed loop. This has a safety advantage, because a person who inadvertently comes into contact with a terminal of the traction power system is not in danger of experiencing electrical shock due to current flow from the traction power system to chassis. In addition to promoting safety, such isolated operation of the traction power system promotes reliability by tending to prevent undesired current flow in sensitive control and ancillary electrical circuits. However, there is always the possibility of formation of an unwanted path for the flow of electrical current or "ground fault" between the nominally isolated traction power system and the chassis, due to moisture, damage, corrosion, or the like. Such a ground fault gives rise to the possibility of current flow through portions of the chassis and sensitive equipment. A more important potential effect of such a ground fault is to place a person in danger of electrical shock should they simultaneously come into inadvertent contact with a terminal of the traction power system and the vehicle chassis, as the traction power system with a ground fault is no longer isolated from chassis. The high voltages and high electrical current capability of a traction power system make such shock potentially lethal. Additionally development of a second ground fault could cause large, potentially destructive currents to flow.

Various systems have been proposed for detecting ground faults in a direct-voltage context. U.S. Pat. No. 5,481,194 issued Jan. 2, 1996 in the name of Schantz et al. describes a system that uses a resistive voltage divider to produce, at its tap or node, a voltage "centered" between the positive and negative direct-voltage buses of the traction power system. The voltage at this node is compared with a reference voltage, and the voltage difference is amplified and compared with a threshold to thereby declare a ground fault if the voltage difference exceeds a particular value. U.S. Pat. No. 5,561,380 issued Oct. 1, 1996 in the name of Sway-Tin et al. includes positive and negative sampling circuits which, in the absence of a ground fault, produce equal-amplitude voltages. In the presence of a ground fault, the sampled voltages become unequal or unbalanced. A ground fault is declared when the inequality exceeds a threshold which varies with the battery voltage. Another ground fault detection scheme is described in an article entitled *DC Leakage Current Detector Protects the High Voltage Equipment User* by Pete Lefferson, published at pages 34–37 of the September 2000 issue of Power Conversion and Intelligent Motion (PCIM). The Lefferson arrangement connects a resistance-capacitance network to a balance point of the direct voltage source, and the voltage across the capacitor is monitored and compared with a threshold. A ground fault is declared when the capacitor voltage exceeds a threshold. Another ground fault detector arrangement is described in U.S. Pat. No. 6,678,132, issued Jan. 13, 2004 in the name of Carruthers et al. In this arrangement, active centering of the balance voltage occurs, and a ground fault is declared when the unbalance exceeds the range of the active centering control.

Improved or alternative ground fault detection arrangements are desired.

SUMMARY OF THE INVENTION

A method for sensing isolation faults in a system including a direct-voltage power supply, which nominally floats relative to a reference conductor. The system also includes a load, and a first terminal of the load is connected to a first terminal of the direct voltage power supply. The method comprises the step of coupling to a node, by an intentional high impedance resistive coupling path having an equivalent resistance, a fixed proportion of the direct voltage of the direct-voltage power supply. The node is connected by a measuring path to the reference conductor. The method also includes the steps, at a first time, of measuring a first current flowing in the measuring path and a first voltage applied to or across the load, and at a second time different from the first time, measuring a second current flowing in the measuring path and a second voltage applied to or across the load. At a time between the first and second times, a second terminal of the direct-voltage power supply is coupled to a second terminal of the load, for energization thereof. At least one of the fault resistance and fault voltage are determined from the equivalent resistance, and the first and second voltages and currents.

According to an aspect of the invention, the step of determining the fault resistance $R_{fault}$ is performed by $$R_{fault} = \frac{V_{link2} - V_{link1}}{2(Ig_{f1} - Ig_{f2})} - \frac{Rg}{2} \quad (1)$$

where:
$V_{link1}$ is the voltage at the load at the first time;
$V_{link2}$ is the voltage at the load at the second time;
$Ig_{f1}$ is the current in the measurement path at the first time;
$Ig_{f2}$ is the current in the measurement path at the second time; and
Rg is the equivalent resistance.

According to another aspect of the invention, the step of determining the fault voltage $V_{fault}$ is performed by $$V_{fault} = \frac{V_{link2}Ig_{f1} - V_{link1}Ig_{f2}}{2(Ig_{f1} - Ig_{f2})} \quad (2)$$

where:
$V_{link1}$ is the voltage at the load at the first time;
$V_{link2}$ is the voltage at the load at the second time;
$Ig_{f1}$ is the current in the measurement path at the first time;
$Ig_{f2}$ is the current in the measurement path at the second time; and
Rg is the equivalent resistance.

In one configuration Rg is a large resistance voltage divider intended to center the battery pack voltage. (Rg is selected so that the maximum current through Rg is less than a given threshold, such as 5 mA (milli amps) or another sufficiently safe value under fault conditions).

DESCRIPTION OF THE INVENTION

Figure 1A:
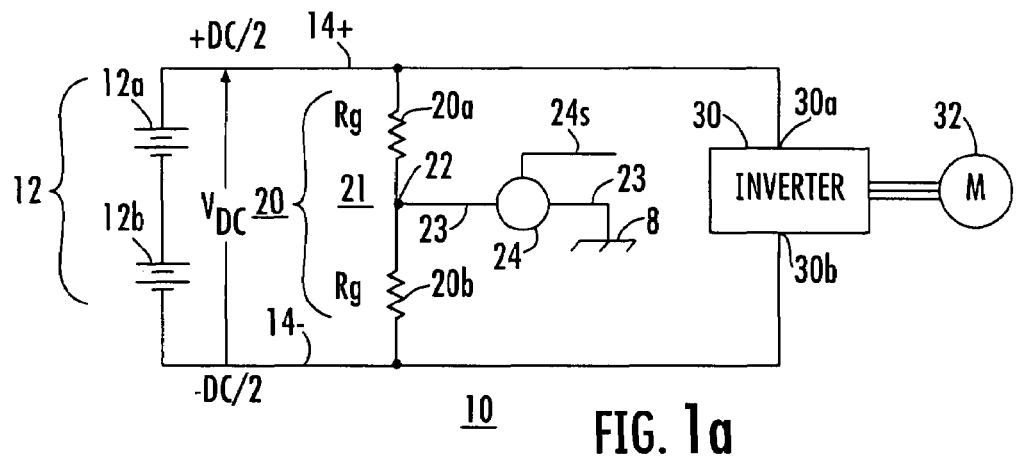
FIG. 1a is a simplified diagram in schematic and block form illustrating the essentials of a direct-voltage system for powering a motor from a battery stack by means of an inverter, and also showing a balance current sensor, all under no-fault operating conditions.

In FIG. 1a, a direct-voltage powered system is designated generally as 10. System 10 includes a direct voltage source designated generally as 12, which includes plural series-connected voltage sources illustrated as electrochemical batteries 12a and 12b. While only two such sources or batteries are illustrated, three or more batteries may be series-connected or stacked to generate the voltage of source 12. Also, while the sources are illustrated as batteries, they may instead be externally-powered electronic devices. The direct voltage source 12 produces its voltage "between" the positive terminal of source 12a and the negative terminal of source 12b. Those skilled in the art know that the term "between" has a meaning in electrical parlance which is different from its meaning in mechanics or topology. The voltage felt "across" the voltage source 12 is designated $V_{DC}$, and is represented by an arrow with the arrowhead adjacent the positive terminal, all as is conventional in the art.

Also in FIG. 1a, the positive (+) voltage from the positive terminal of voltage source 12a is connected by way of a conductor 14+ to a terminal 30a of a load such as an inverter, power converter, DC/DC converter or other such high voltage device or system, illustrated generally as a block 30. The total equivalent voltage of source 12 is illustrated as an arrow $V_{DC}$. The negative (−) voltage from the negative terminal of voltage source 12b is connected by way of a conductor 14− to a terminal 30b of inverter block 30 (i.e. load 30). The coupling of the positive and negative voltages to inverter 30 energizes the inverter, and allows it to generate suitable voltages, which may be alternating voltages, for the operation of a second load 32, which is illustrated as being an electric motor M. In the context of a vehicle which is powered in whole or in part by electricity, the motor 32 may be a traction motor.

A balance circuit designated generally as 20 is connected "between" conductors or buses 14+ and 14− in FIG. 1. The balance circuit 20 includes a voltage divider 21, well known in the art, including first and second series-connected resistance devices, such as resistors 20a and 20b, and also including a tap point 22 therebetween. As illustrated, the values of resistors 20a and 20b are both selected to be $R_g$, (with the value to be selected intended to limit ground fault current to a safe value) but in the general case they may have disparate values. Also, the resistance provided by each of resistors 20a and 20b of FIG. 1a can be provided by a plurality of series-, parallel-, or series-parallel-connected resistors or resistance devices, all as is known to those skilled in the art. As mentioned, when voltage source 12 has a "high" voltage, which is to say a voltage which is great enough to cause injury or death to an individual, ground faults should be detected, and when a ground fault is detected, the voltage source 12 should be disconnected, or at least a warning given of the existence of the ground fault.

One way to determine the presence of a ground fault in a system such as that of FIG. 1a is to measure the current flowing in a sensing path 23 extending between tap point or node 22 and "chassis" ground 8. In FIG. 1a, item 24 represents an in-line current sensor, which produces a signal on a signal path 24s representing the current flowing in sensing path 23. In-the no-ground-fault condition illustrated in FIG. 1a, no current loop exists which includes the ground 8, and as a result no current flows in sensing path 23. Consequently, the signal on signal path 24s will represent zero current in sensing path 23, which is interpreted a no-fault condition.

Figure 1B:
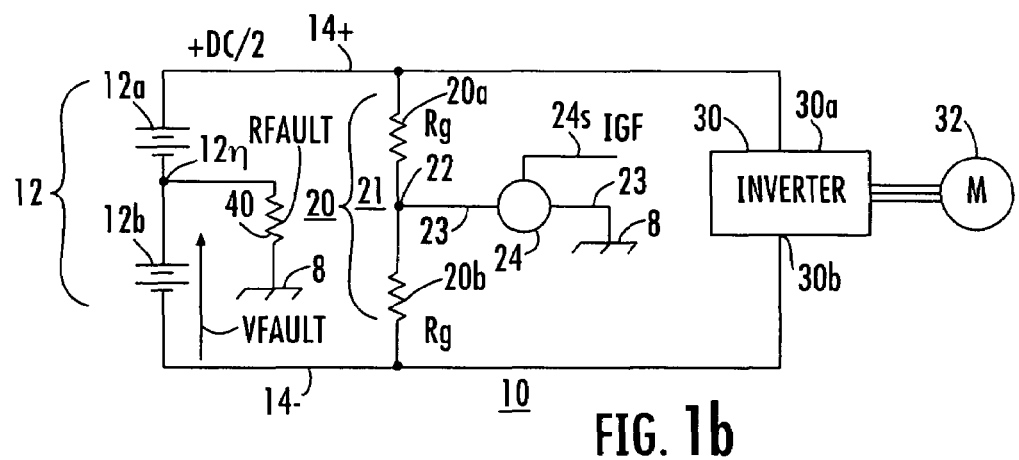
FIG. 1b is a corresponding diagram under ground-fault conditions.

FIG. 1b illustrates the circuit of FIG. 1a in the presence of a generalized ground fault. Elements of FIG. 1b corresponding to those of FIG. 1a are designated by like reference numerals. In FIG. 1b, the ground fault is a resistive signal path illustrated as a resistor 40 having a value of $R_{fault}$, extending to chassis ground 8 from a tap point 12n at the junction or connection of the negative terminal of voltage source 12a with the positive terminal of source 12b. It should be noted that it is not necessary that a ground fault occur in the illustrated location, but it may occur anywhere, including between either of the buses 14+ or 14− and chassis ground, and the analysis and explanation remain the same. In the circuit of FIG. 1b, the Thevenin equivalent fault voltage $V_{fault}$ is illustrated by an arrow.

Figure 1C:
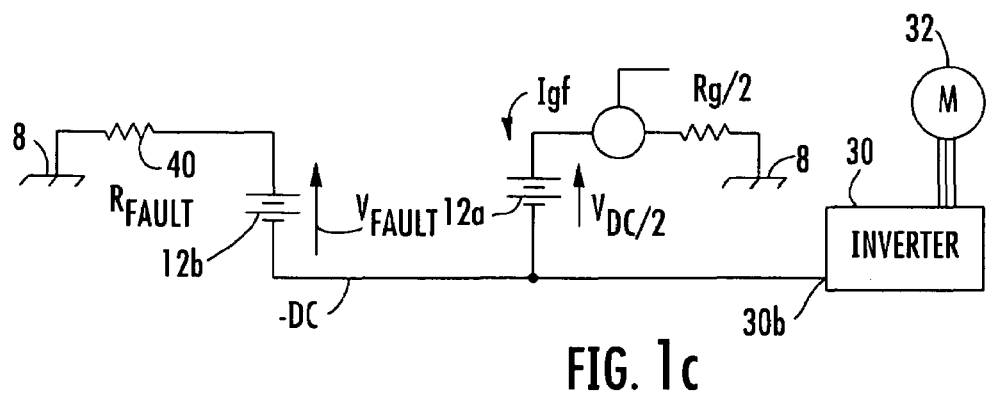
FIG. 1c is a Thevenin equivalent diagram of the circuit of FIG. 1b.

FIG. 1c is a Thevenin equivalent circuit of the circuit of FIG. 1b. AS illustrated in FIG. 1c, there is no current loop which includes inverter 30, so no current flows in the circuit branch of the inverter. The remaining circuit consists solely of a series circuit in which the ground-fault voltage $V_{fault}$ opposes $V_{DC}/2$ ($V_{fault}$ is in a polarity opposite to $V_{DC}/2$), where $V_{DC}/2$ is the Thevenin equivalent voltage at node 22 of FIG. 1b. Current in the path of FIG. 1c is resisted by the series combination of the fault resistance $R_{fault}$ 40 and the Thevenin equivalent resistance $R_g/2$ of voltage divider 21 of FIG. 1b. More particularly, the ground fault current $I_{gf}$ in the arrangement of FIGS. 1b and 1c is given by $$I_{gf} = \frac{V_{fault} - \frac{V_{DC}}{2}}{R_{fault} + \frac{R_g}{2}} \qquad (1)$$

Inspection of equation (1) shows that for a fixed value of $R_{fault}$, $I_{GF}$ diminishes as $V_{fault}$ approaches $V_{dc}/2$. Consequently, faults which occur near the center of the direct-voltage link exhibit small node 22 voltages, and correspondingly small fault currents, even when the fault is "hard" or has low resistance. Fault detection systems which depend upon sensing fault current at a balance point in the system thus do not provide the best possible protection against certain ground faults.

Figure 2A:
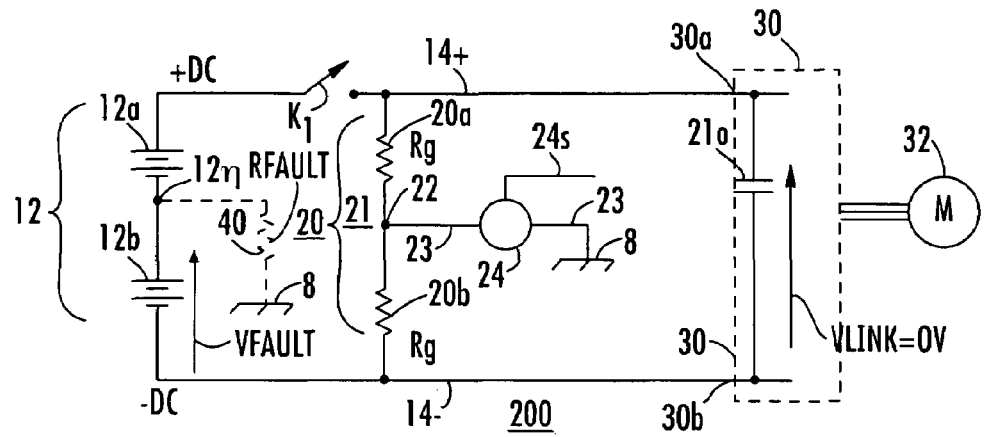
FIG. 2a is a simplified diagram, similar to FIG. 1a but including a switch or contactor, and also illustrating capacitance in an inverter.

FIG. 2a illustrates a direct voltage power system 200 similar to that of FIG. 1b. In the arrangement of FIG. 2a, a capacitor 210 shown in inverter 30 represents the DC link capacitance between conductors 14+ and 14−. Also in FIG. 2a, a contactor, switch or relay contact arrangement K1 is interposed between the positive (+) terminal of voltage source 12 and bus conductor 14+. Such a contactor or switch is commonly provided in order to be able to turn OFF or deenergize the load, which in this case includes inverter 30, without removing the battery pack of source 12. In the case illustrated in FIG. 2a, contactor K1 is open or nonconductive. Consequently, there is no "floating" or isolated path for the flow of current from voltage source 12 to the load including inverter 30. The ground fault resistance 40 having value $R_{fault}$ is illustrated in phantom, to thereby indicate that it may either be present or absent. If the ground fault 40 $R_{fault}$ is absent, no current loop exists which passes through ground fault current sensing path 23, and no ground fault current can flow. Consequently, no ground fault current representative signal will be generated on signal path 24s by sensor 24.

Figure 2B:
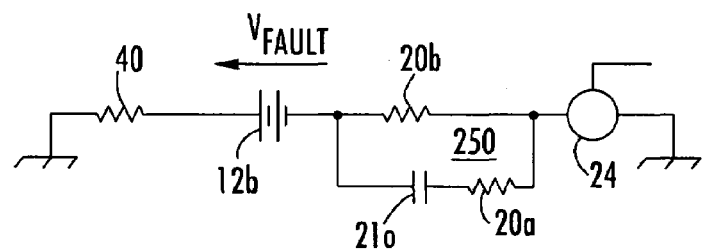
FIG. 2b is a Thevenin equivalent circuit of the arrangement of FIG. 2a, FIG. 2c is similar to FIG. 2a, but with the contactor in the opposite state.

If, on the other hand, a ground fault 40 exists in the arrangement of FIG. 2a, the Thevenin equivalent circuit of FIG. 2b shows that the ground fault 40 provides a path for the flow of current under the impetus of the fault voltage $V_{fault}$, impeded by the series combination of the fault resistance and the parallel combination 250. Combination 250 includes resistor 20b in parallel with the series circuit consisting of resistor 20a and capacitor 210. Note that Capacitor C210 is assumed to not charge significantly due to fault current. This assumption is based on the relatively large capacitance values (for example, C210 may be on the order of tens to thousands of microfarads) and large resistance values (for example, Resistors 20a, 20b may be on the order of ten to thousands of kilo ohms) such that the RC time constant for charging the capacitor is substantially greater than the time period associated with sensing the fault current. Consequently, the fault current $I_{fault}$ sensed by sensor 24 in such a situation will be equal to the fault voltage divided by the sum of the fault 40 resistance $R_{fault}$ and the resistance $R_g$ of resistor 20b.

$$I_{fault} = \frac{V_{fault}}{R_{fault} + R_g} \quad (2)$$

Figure 2C:
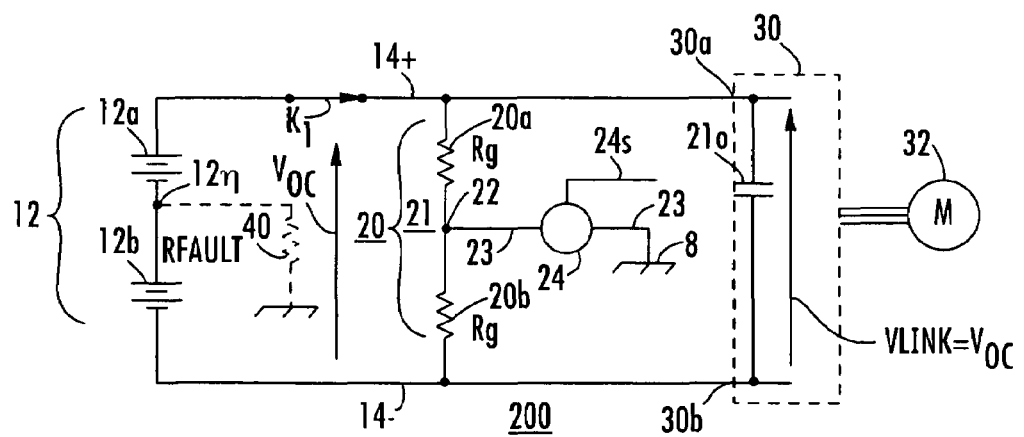
FIG. 2d is a Thevenin equivalent diagram of the arrangement of FIG. 2c in the presence of a ground fault.

Elements of FIG. 2c corresponding to those of FIG. 2a are designated by like reference alphanumerics. FIG. 2c illustrates the arrangement of FIG. 2a with the contactor K1 closed or conductive, to thereby complete a current loop from the positive (+) terminal of battery 12a through contactor K1, and by way of conductor bus 14+ to terminal 30a of inverter 30, through the inverter 30, and returning to the voltage source 12 by way of conductor bus 14−. In FIG. 2c, the link voltage appearing across capacitor 210 is illustrated by an arrow $V_{link} = V_{DC}$.

In the absence of a ground fault 40 in the arrangement of FIG. 2c, no current loop includes chassis ground 8, and therefore no current flows in sensing path 23. With no current in sensing path 23, current sensor 24 produces a signal on signal path 24S indicative of zero current, which is interpreted as being a no-fault condition.

Figure 2D:
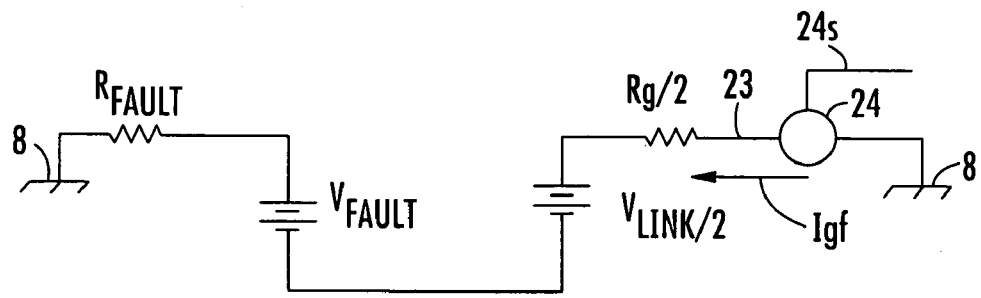

In the presence of a ground fault 40 in the arrangement of FIG. 2c, the Thevenin equivalent circuit of FIG. 2d can be used to determine the effect. In FIG. 2d, the current in sensing path 23 which can be sensed by sensor 24, regardless of the presence or absence of a fault, is $$I_{gf\_i} = \frac{V_{fault} - \frac{V_{link\_i}}{2}}{R_{fault} + \frac{R_g}{2}} \quad (3)$$

where:
$I_{gf\_i}$ is the fault current in sensing path 23 at time i;
$V_{fault}$ is the fault voltage;
$V_{link\_i}$ is the direct voltage applied to the load at time i;
$R_{fault}$ is the resistance of the ground fault; and
$R_g$ is the equivalent resistance of the balance circuit 20.

In the absence of a ground fault, $V_{fault}$ equals zero, and $R_{fault}$ equals infinity (∞). Applying this condition to Equation (3), the corresponding fault current $I_{gf\_i}$ is $$I_{gf\_i} = \frac{0 - \frac{V_{link\_i}}{2}}{\infty + \frac{R_g}{2}} \quad (4)$$

where the denominator is infinitely large, so the current is zero, regardless of the applied voltage.

According to an aspect of the invention, the ground fault current in signal path 23 of FIG. 2a or 2c is measured under two conditions, namely for two different values of the link voltage Vlink, typically but not necessarily obtained before and after application of voltage $V_{link}$ to the load 30.

The measurement of fault current in sensing path 23 of FIGS. 2a and 2f before and after application of $V_{link}$ allows two equations of the form (3) to be solved for the two unknowns, which are the fault voltage $V_{fault}$ and the fault resistance $R_{fault}$. More particularly, the fault resistance $R_{fault}$ is given by $$R_{fault} = \frac{Vlink_1 - Vlink_2}{2(I_{gf1} - I_{gf2})} - \frac{Rg}{2} \quad (5)$$

where
Vlink$_1$ is the voltage appearing at the load 30 (i.e DC link) with contactor K1 open. Vlink$_2$ is the voltage applied across the load by the closure of contactor K1;
$I_{gf1}$ is the current in sensing path 23 when Vlink$_1$ is applied to the load (inverter 30);
$I_{gf2}$ is the current in sensing path 23 when Vlink$_2$ is applied to the load (inverter 30); and
$R_g$ is the equivalent resistance of balance circuit 20, corresponding to the parallel impedance of voltage divider 21, which equals half the value of resistance 20a or 20b when they have equal value.

The fault voltage Vfault is given by $$V_{fault} = \frac{Vlink_2 I_{gf_1} - Vlink_1 I_{gf_2}}{2(I_{gf_1} - I_{gf_2})} \quad (6)$$

For a finite difference between Vlink$_1$ and Vlink$_2$ and a finite value of $R_{fault}$, the difference between Igf$_1$ and IGf$_2$ is independent of Vfault:

$$Igf_1 - Igf_2 = \frac{Vlink_1 - Vlink_2}{2R_{fault} + Rg} \quad (7)$$

Therefore a value of Rfault can be identified regardless of the location of the fault.

The value of $R_{fault}$ and $V_{fault}$ can be assessed by use of equations (5) and (6), respectively, given the link voltages and the fault currents, for any reasonable difference between link voltages, independent of the value of $V_{fault}$. In those cases in which the value of $R_{fault}$ is very large, the difference between Igf$_1$ and IGf$_2$ tends toward zero. However, in this case the importance of identifying the exact values of $R_{fault}$ and $V_{fault}$ diminishes. Divide-by-zero protection can be used in the software performing the calculations, and the value of $R_{fault}$ deemed to exceed a given value when such protection is enabled.

Figure 3:
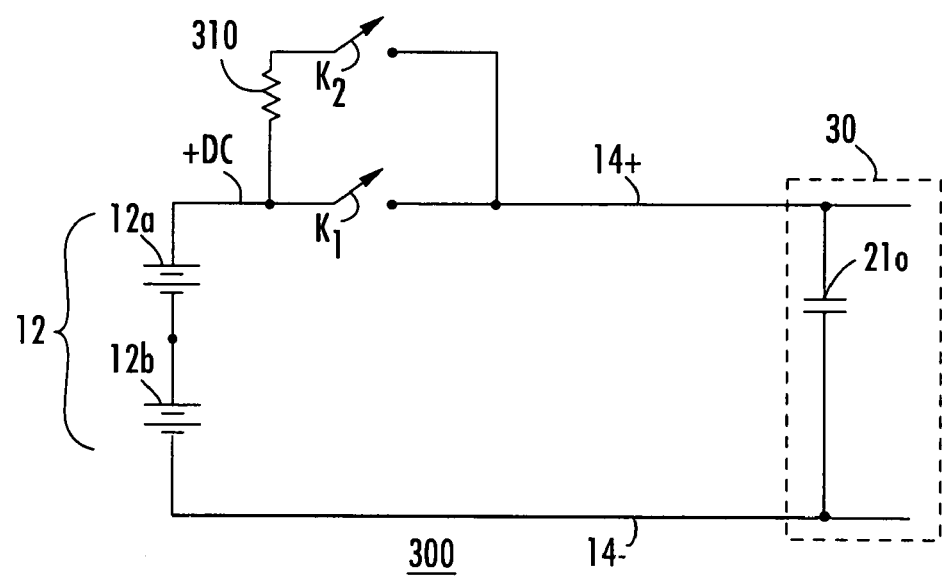
FIG. 3 is a simplified diagram illustrating an alternative arrangement for applying power to the load by the use of a precharge circuit and contactor.

In an actual implementation of a direct-voltage power supply such as that described in conjunction with FIG. 2a or 2c, measures are often taken to prevent the flow of large inrush currents when the contactor K1 is closed or rendered conductive. These currents are attributable to the presence of capacitor 210 in the load circuit 30 (which is coupled to the secondary load or motor 32 to be driven by the device). Large inrush currents can damage the capacitor or contactor, and can also damage the direct voltage source, whether it be in the form of electronic supplies or a stack of electrochemical batteries. Consequently, a soft start or capacitor precharge operation precedes the actual closure of contactor K1. FIG. 3 is a simplified illustration of one possible soft start or precharging arrangement. In FIG. 3, elements corresponding to those of FIGS. 2a and 2c are identified by the same reference alphanumerics. As illustrated in FIG. 3, contactor K1 is paralleled by a series circuit 300 including a resistor 310 and a second contactor K2. Before the time at which contactor K1 is closed to allow unrestricted flow of current to the load 30, contactor K2 is closed or rendered conductive to allow a flow of current, limited by the presence of the resistance of resistor 310. A limited amount of current flowing through resistor 310 and contactor K2 allows capacitor 210 to achieve a charge before contactor K1 is closed, to thereby reduce the magnitude of the inrush current and to thereby protect the capacitor, contactor K1, and the direct voltage source 12. The measurement of the values of link voltage and fault current can be performed before and after contactor K2 is closed (if present), or before and after contactor K1 is closed, or before and after both K2 and K1 are closed, as may be desired.

Note further that one is not constrained to perform such measurements before and after precharge. In the case where the DC link voltage varies slowly and with enough magnitude during normal operation of the system, the present invention contemplates detection and determination of the fault resistance and voltage periodically during such operation.

Depending upon the accuracy of the acquired data, the value of $V_{fault}$ can be used to aid in identifying possible locations of the fault. For example, when the direct voltage source (12 of FIGS. 2a and 2c) is a stack including a plurality of discrete batteries, the fault voltage may indicate to which of the batteries the fault resistance is connected.

Current electrically powered vehicles are computerized, and often include measurement systems for measuring the voltage across the inverter or load, so this part of the required equipment is already available. In addition, if the current vehicle includes a resistive balance circuit, almost all the hardware is already in place, and all that is required is to conform the computer software to the method of the invention.

Some of the advantages obtainable by various embodiments of the invention include simple retrofittable implementation using simple resistive centering, with the need, in some cases, only of software changes. Under certain circumstances, the location of the ground fault can be determined. The value of the fault resistance can be determined independent of the fault location. Monitoring of ground faults which do not appear at the center voltage of the pack can be continuously provided. By comparison with some complex prior-art center-of-battery-pack ground fault detection schemes, the described invention is relatively simple.

A method for sensing isolation faults (40) in a system (FIGS. 2a, 2c) including a direct-voltage power supply (12), which nominally floats relative to a reference conductor (8). The system (FIGS. 2a, 2c) also includes a load (30, 32), and a first (30b) terminal of the load (30, 32) is connected to a first terminal (−) of the direct voltage power supply (12). The method comprises the step of coupling to a node (22), by a resistive coupling path (20) having an equivalent resistance (Rg/2 in the example), a fixed proportion (half in the example) of the direct voltage of the direct-voltage power supply (12). The node (22) is connected by a measuring path (23) to the reference conductor (8). The method also includes the steps, at a first time, of measuring a first current ($Igf_1$) flowing in the measuring path (23) and a first voltage ($Vlink_1$) applied to or across the load (30, 32), and at a second time different from the first time, measuring a second current ($Igf_2$) flowing in the measuring path (23) and a second voltage ($Vlink_2$) applied to or across the load (30, 32). At a time between the first and second times, a second terminal (+) of the direct-voltage power supply is coupled to a second terminal (30a) of the load (30, 32), for energization thereof. At least one of the fault resistance and voltage are determined from the equivalent resistance, and the first and second voltages and currents.

What is claimed is:

1. A method for sensing isolation faults in a system including a direct-voltage power supply, which direct-voltage power supply nominally floats relative to a reference conductor, and in which the system also includes a load, a first terminal of which load is connected to a first terminal of said direct voltage power supply, said method comprising the steps of:

coupling to a node, by a resistive coupling path having an equivalent resistance, a fixed proportion of the direct voltage of said direct-voltage power supply, said node being connected by a measuring path to said reference conductor;

measuring a first current flowing in said measuring path at a first, time;

measuring a first voltage applied to said load at said first time;

measuring a second current flowing in said measuring path at a second time different from said first time;

measuring a second voltage applied to said load at said second time;

at a time between said first and second times, coupling a second terminal of said direct-voltage power supply to a second terminal of said load, for energization thereof; and determining, from said equivalent resistance, and said first and second voltages and currents, at least one of fault voltage and resistance.

2. A method according to claim 1, wherein said step of determining said fault resistance $R_{fault}$ is performed by $$R_{fault} = \frac{V_{link2} - V_{link1}}{2(Ig_{f1} - Ig_{f2})} - \frac{Rg}{2} \qquad (1)$$

where:

$V_{link1}$ is the voltage at load at said first time;
$V_{link2}$ is the voltage at said load at said second time;
$Ig_{f1}$ is the current in said measurement path at said first time;
$Ig_{f2}$ is the current in said measurement path at said second time; and
Rg is said equivalent resistance.

3. A method according to claim 1, wherein said step of determining said fault voltage $V_{fault}$ is established by $$V_{fault} = \frac{V_{link2}Ig_{f1} - V_{link1}Ig_{f2}}{2(Ig_{f1} - Ig_{f2})} \qquad (2)$$

where:

$V_{link1}$ is the voltage at said load at said first time;
$V_{link2}$ is the voltage at said load at said second time;
$Ig_{f1}$ is the current in said measurement path at said first time; and
$Ig_{f2}$ is the current in said measurement path at said second time.

4. A method according to claim 3, wherein the voltage Vfault is referenced to the negative terminal of the load.

5. A method according to claim 1, wherein said steps of measuring a first voltage at said load, and measuring a second voltage at said load, are performed by measuring voltage across said load.

* * * * *